United States Patent
Nishino

(10) Patent No.: US 7,006,341 B2
(45) Date of Patent: Feb. 28, 2006

(54) MULTICHIP MODULE AND MULTICHIP SHUTDOWN METHOD

(75) Inventor: Yasuji Nishino, Tokyo (JP)

(73) Assignee: Sony Corporation, Tokyo (JP)

( * ) Notice: Subject to any disclaimer, the term of this patent is extended or adjusted under 35 U.S.C. 154(b) by 170 days.

(21) Appl. No.: 10/631,639

(22) Filed: Jul. 31, 2003

(65) Prior Publication Data

US 2004/0094844 A1 May 20, 2004

(30) Foreign Application Priority Data

Aug. 1, 2002 (JP) .............................. 2002-224977

(51) Int. Cl.
*H02H 5/04* (2006.01)
(52) U.S. Cl. ..................................... 361/103; 257/678
(58) Field of Classification Search ................ 257/470, 257/777, 678; 361/87, 93.8, 103
See application file for complete search history.

(56) References Cited

U.S. PATENT DOCUMENTS

| | | | |
|---|---|---|---|
| 4,896,245 A * | 1/1990 | Qualich | ...................... 361/103 |
| 5,206,778 A | 4/1993 | Flynn et al. | |
| 6,373,671 B1 * | 4/2002 | Watanabe et al. | ........... 361/93.8 |
| 6,594,129 B1 * | 7/2003 | Baba et al. | .................... 361/87 |
| 6,667,868 B1 * | 12/2003 | Portaluri et al. | ............ 361/103 |
| 6,751,080 B1 * | 6/2004 | Yamaji | ....................... 361/93.8 |

FOREIGN PATENT DOCUMENTS

| | | |
|---|---|---|
| EP | 0429282 | 5/1991 |
| EP | 0821459 | 1/1999 |
| GB | 2273213 | 6/1994 |

* cited by examiner

*Primary Examiner*—David Nelms
*Assistant Examiner*—Dao H. Nguyen
(74) *Attorney, Agent, or Firm*—Finnegan, Henderson, Farabow, Garrett & Dunner, L.L.P.

(57) ABSTRACT

In the multichip module and shutdown method thereof, there are provided a semiconductor chip for voltage regulation which shuts itself down at a first setup temperature and a semiconductor chip for amplifier which is disposed in a common package together with the semiconductor chip for voltage regulation and shuts itself down at a second setup temperature. The semiconductor chip for voltage regulation is provided with means for outputting via a bus a signal for compulsorily shutting down the semiconductor chip for amplifier when the semiconductor chip for voltage regulation reaches a third setup temperature lower than the first setup temperature.

5 Claims, 4 Drawing Sheets

MULTICHIP MODULE AND MULTICHIP SHUTDOWN METHOD

CROSS REFERENCE TO RELATED APPLICATIONS

The present document is based on Japanese Priority Application JP2002-224977, filed in the Japanese Patent Office on Aug. 1, 2002, the contents of which being incorporated herein by reference to the extent permitted by law.

BACKGROUND OF THE INVENTION

1. Field of the Invention

The present invention relates to a multichip module in which a plurality of semiconductor chips such as ICs (Integrated Circuits) and LSI (Large Scale Integration) devices are disposed in a single package, more specifically to a multichip module provided with a temperature control function against overheating.

2. Related Art

In recent years, an increasing density of electronic circuits including computers and peripheral equipment, mobile equipment such as cellular phones, onboard equipment such as car navigation systems, etc. has been accomplished and there is strong demand for downsizing, higher integration and larger capacity of IC and LSI packages. On the other hand, there is strong expectation for a system LSI in which a system comprising a plurality of ICs and/or LSI devices is fabricated on a single chip (i.e., a single silicon substrate). However, designing on a single chip increases development cost and time and also requires large investments and the like for increasing integration. In order to provide a single LSI, a so-called multichip module technology in which a plurality of semiconductor chips are mounted on and sealed in a single package has been attracting attention in recent years, as an approach from packaging technologies.

As compared to a conventional interconnect of a plurality of semiconductor chips on a printed circuit board on which discrete components such as resistors, capacitors and the like are mounted on a relatively wide area, the multichip module technology is effective to decrease total length of interconnect patterns, downsize and also improve noise performance including reduced EMI (Electro Magnetic Interference). Also, in addition to the capability of installing existing LSI devices without any modification and thus maintaining essentially the same reliability as conventional packages, it is possible to significantly reduce the time required for the development. Moreover, it is possible to install modules of different fabrication processes in various combinations, thereby providing more versatile and yet less expensive semiconductor devices.

SUMMARY OF THE INVENTION

It is common that each integrated semiconductor chip is provided with a thermal shutdown circuit (i.e., an overheat protection circuit). The thermal shutdown circuit is a circuit designed to protect each chip from heat stress by disabling such chip and reducing power consumption of the device in case when the chip generates excessive heat due to over power or the like. Semiconductor chips constituting a multichip are individually provided with a thermal shutdown circuit for individually shutting down by utilizing such shutdown circuits. Since a plurality of semiconductor chips are disposed adjacent to one another in a multichip, heats generated from adjacent semiconductor chips influence reciprocally so that unexpected shutdown may take place. Particularly, it is a problem that a semiconductor chip in which no shutdown is supposed to take place reaches high temperature under the influence of adjacent semiconductor chips which generate a large amount of heat, thereby shutting down the semiconductor chip.

Additionally, in case there is variation in the setup shutdown temperature, shutdown may take place earlier in a semiconductor chip with a higher setup temperature, where shutdown should occur from a semiconductor chip with a lower setup temperature. Furthermore, when semiconductor chips are intended to be shutdown in a predetermined priority sequence, it is required to differentiate the setup temperatures by taking the variations into consideration. In case when variation in the setup temperature in one semiconductor chip is, for example, approximately ±10° C., it is necessary to differentiate the setup temperature by approximately 20° C., which is hardly acceptable in design from a reliability point of view. Also, in this case, the semiconductor chip which should be shut down with higher priority is required to have the setup temperature to an extremely low value, thereby causing too frequent shutdowns.

In consideration of the technical problems as described hereinabove, the present invention has been conceived so as to provide a so-called multichip module having a plurality of semiconductor chips disposed in a single package and capable of properly shutting down each of the semiconductor chips.

Present invention also aims at shutting down by giving priority sequence for each semiconductor chip, without requiring to take notice of variation in the setup temperature of each semiconductor chip.

The present invention also aims at providing a multichip module which is capable of controlling the shutdown of the semiconductor chips installed in such multichip module without the need for special external control.

A multichip module according to a preferred embodiment of the present invention includes in a same package a first semiconductor chip and a second semiconductor chip that automatically shut down when respectively reaching a predetermined temperature, the multichip module including: a setup temperature detection means provided in said first semiconductor chip for detecting whether or not said first semiconductor chip has reached a previously set setup temperature; and a compulsory shutdown means for compulsorily shutting down said second semiconductor chip based on a detection of said setup temperature by said setup temperature detection means.

In addition, it is preferable that the multichip module has the setup temperature detected by the setup temperature detection means lower than a temperature that shuts down the first semiconductor chip. Also, it is preferable that the multichip module has the compulsory shutdown means that shuts down the second semiconductor chip based on a shutdown signal outputted from the first semiconductor chip. Furthermore, the first semiconductor chip may be a power semiconductor chip for supplying a predetermined electric power to an onboard audio equipment; and the second semiconductor chip may be an amplifying semiconductor chip for amplifying an audio signal of the onboard audio equipment.

According to another preferred embodiment of the present inventio, there is provided a multichip module including: a first semiconductor chip that shuts itself down based on a first setup temperature; and a second semiconductor chip provided in a same package with the first semiconductor chip and that shuts itself down based on a second setup temperature; the first semiconductor chip outputs a signal for shutting down the second semiconductor chip, when reaching a third setup temperature which is lower than the first setup temperature.

Moreover, a multichip shutdown method for a multichip having a plurality of semiconductor chips having priority sequence for shutdown included in a same package, according to a preferred embodiment of the present invention includes: determining whether a first semiconductor chip having a lowest shutdown priority has reached a setup temperature; and compulsorily shutting down a second semiconductor chip of higher shutdown priority if the first semiconductor chip has reached the setup temperature.

As a result, the so-called multichip module having a plurality of semiconductor chips disposed in a single package according to the preferred embodiments of present invention may have each of the semiconductor chips appropriately shut down.

BRIEF DESCRIPTION OF THE DRAWINGS

The above and other objects, features and advantages of the present invention will become more apparent to those skilled in the art from the following description of the presently preferred exemplary embodiments of the invention taken in conjunction with the accompanying drawings, in which.

DESCRIPTION OF THE PREFERRED EMBODIMENTS

Now, a preferred embodiment of the present invention will be described in detail hereunder by reference to the accompanying drawings.

Figure 1:
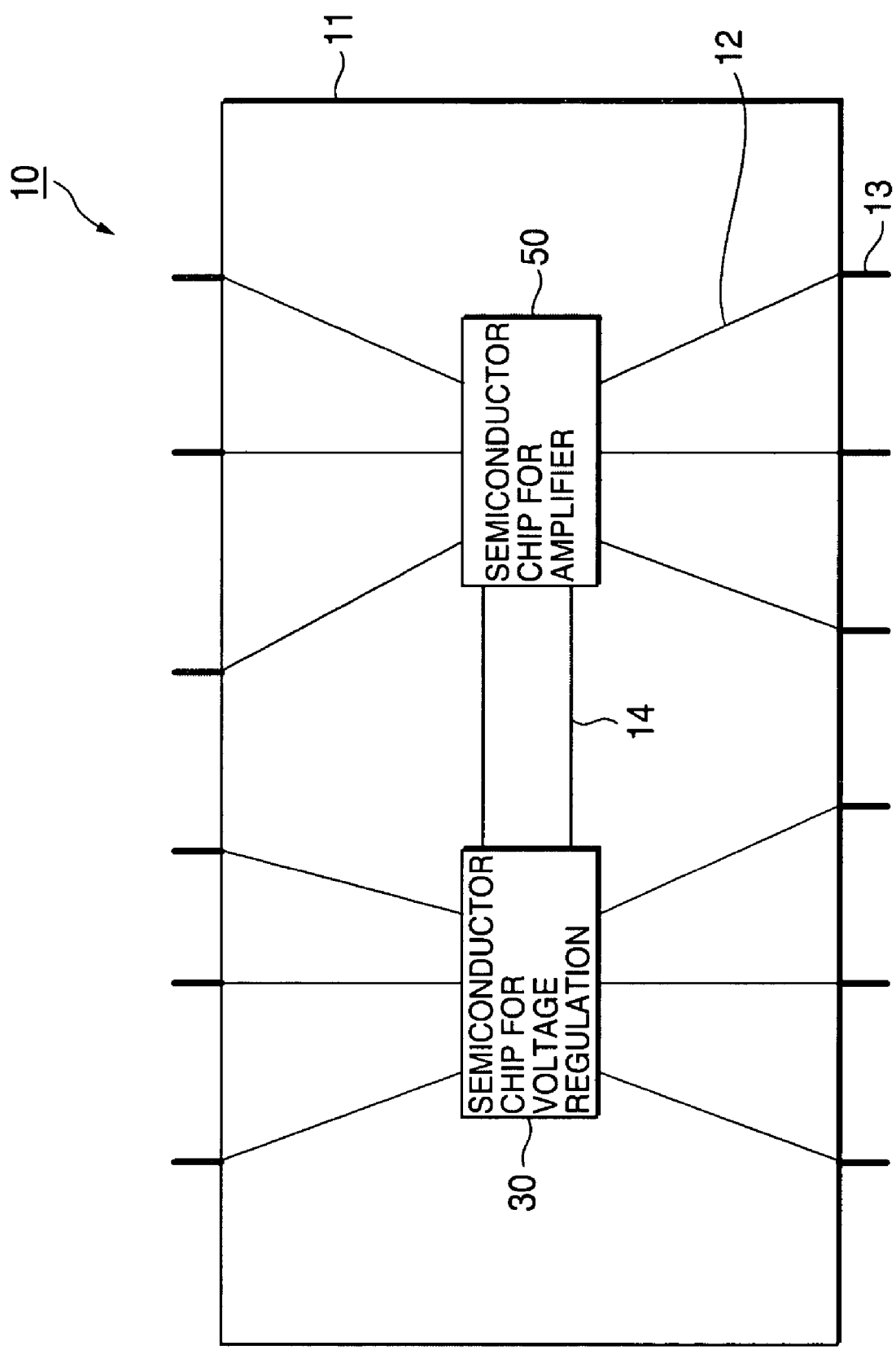
FIG. 1 illustrates the construction of the semiconductor multichip module to which a preferred embodiment of the present invention is applied.

FIG. 1 illustrates the construction of the semiconductor multichip module to which a preferred embodiment of the present invention is applied. In FIG. 1, a multichip module 10 comprises a semiconductor chip for voltage regulation 30 which is a first semiconductor chip and a semiconductor chip for amplifier 50 which is a second semiconductor chip disposed on a substrate 11 and assembled in a single package. The semiconductor chip for voltage regulation 30 and the semiconductor chip for amplifier 50 are provided with terminals 13 which are made of interconnect pattern (lead frame) 12 formed on the substrate 11. In the embodiment as illustrated in FIG. 1, a package is formed with a plurality of terminals 13 to have, for example, 12 pin outputs. The semiconductor chip for voltage regulation 30 and the semiconductor chip for amplifier 50 are interconnected via a bus 14. It is also possible to provide simple control lines within the package instead of using the bus 14 which is provided within the package. Inter-chip communication is performed between the semiconductor chip for voltage regulation 30 and the semiconductor chip for amplifier 50 by utilizing the bus 14.

The multichip module 10 in the preferred embodiment of the present invention can be applied to, for example, an audio equipment to be installed in a vehicle. Particularly, equipment installed in a vehicle are often used at high temperature and most audio equipment installed in a vehicle are required to have high output powers. The semiconductor chip for voltage regulation 30 disposed in the multichip module 10 is designed to supply various voltages such as, for example, 9 volts, 5 volts, 3 volts and the like required in, for example, an audio equipment to be installed in a vehicle. On the other hand, the semiconductor chip for amplifier 50 disposed in the multichip module 10 amplifies audio signals and drives speakers for, for example, an audio set installed in a vehicle. The semiconductor chip for voltage regulation 30 and the semiconductor chip for amplifier 50 are provided with means for protecting respective chips from heat stress by disabling the chips to reduce power consumption of the equipment in case of generating excessive heat in the respective chips.

Figure 2:
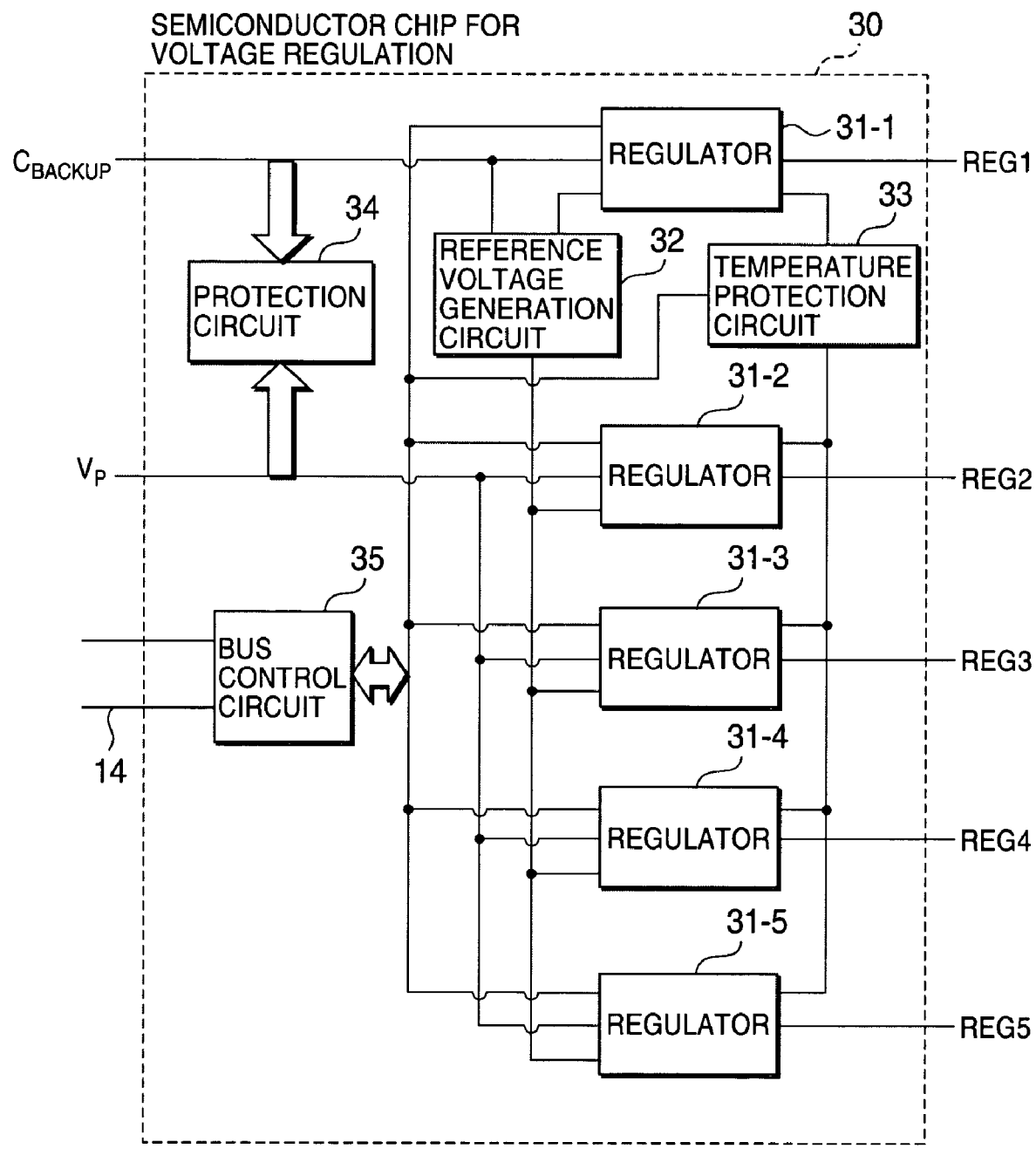
FIG. 2 illustrates the construction of a semiconductor chip for voltage regulation, according to a preferred embodiment of the present invention.

FIG. 2 illustrates the construction of the semiconductor chip for voltage regulation 30. The semiconductor chip for voltage regulation 30 which is utilized in the preferred embodiment of the present invention comprises, for example, five regulators (31-1 to 31-5) for regulating voltages and provides various voltages required for operating the equipment. Also included are a reference voltage generation circuit 32 for generating a reference voltage Vref which is the same level as the internal power supply voltage, a temperature protection circuit 33 for outputting shutdown instructions upon detection of temperature rise inside the semiconductor chip for voltage regulation 30, a protection circuit 34 for protecting the chip by shutting down the outputs of the regulators (31-1 to 31-5) in case, for example, when high voltage such as, for example, tens of volts is supplied and a bus control circuit 35 for performing information transmission with the semiconductor chip for amplifier 50 in conformity to, for example, the I2C (Inter Integrated Circuit) standard. The I2C which is proposed by Philips Electronics is a serial interface for performing information transmission between devices by SCL (Serial Clock) and SDA (Serial Data). In this preferred embodiment of the present invention, for example, the semiconductor chip for voltage regulation 30 acts as a master, while the semiconductor chip for amplifier 50 acts as a slave, thereby outputting the shutdown signal from the semiconductor chip for voltage regulation 30 to the semiconductor chip for amplifier 50 via the bus 14. Information of the predetermined setup temperatures (i.e., first and third setup temperatures which will be described hereinafter) is stored in a memory which is provided in the temperature protection circuit 33 or a memory provided at any other location.

The reference voltage Vref which is generated by the reference voltage generation circuit 32 is supplied to the regulators (31-1 to 31-5) and supplied to the reference voltage generation circuit 32 is the internal power supply voltage to be supplied to the internal circuit of, for example, an audio equipment which is installed in a vehicle. The temperature protection circuit 33 is provided with a thermistor which is connected between, for example, the power supply voltage and the ground and provides variable electrical resistance depending on temperature change and detects temperature rise by the electrical resistance of the thermistor. At the time when the predetermined temperature (for example, 180° C. as the first setup temperature) stored in advance has been reached, control is made to shut down the outputs from the regulators (31-1 to 31-5) and thus interrupting the outputs from the regulators (31-1 to 31-5). The first setup temperature is set as the appropriate temperature for its own temperature protection. The temperature protection circuit 33 also outputs the shutdown signal to the bus control circuit 35 at the time when the predetermined setup temperature (for example, 170° C. as the third setup temperature) lower than the above-mentioned first setup temperature has been reached.

Figure 3:
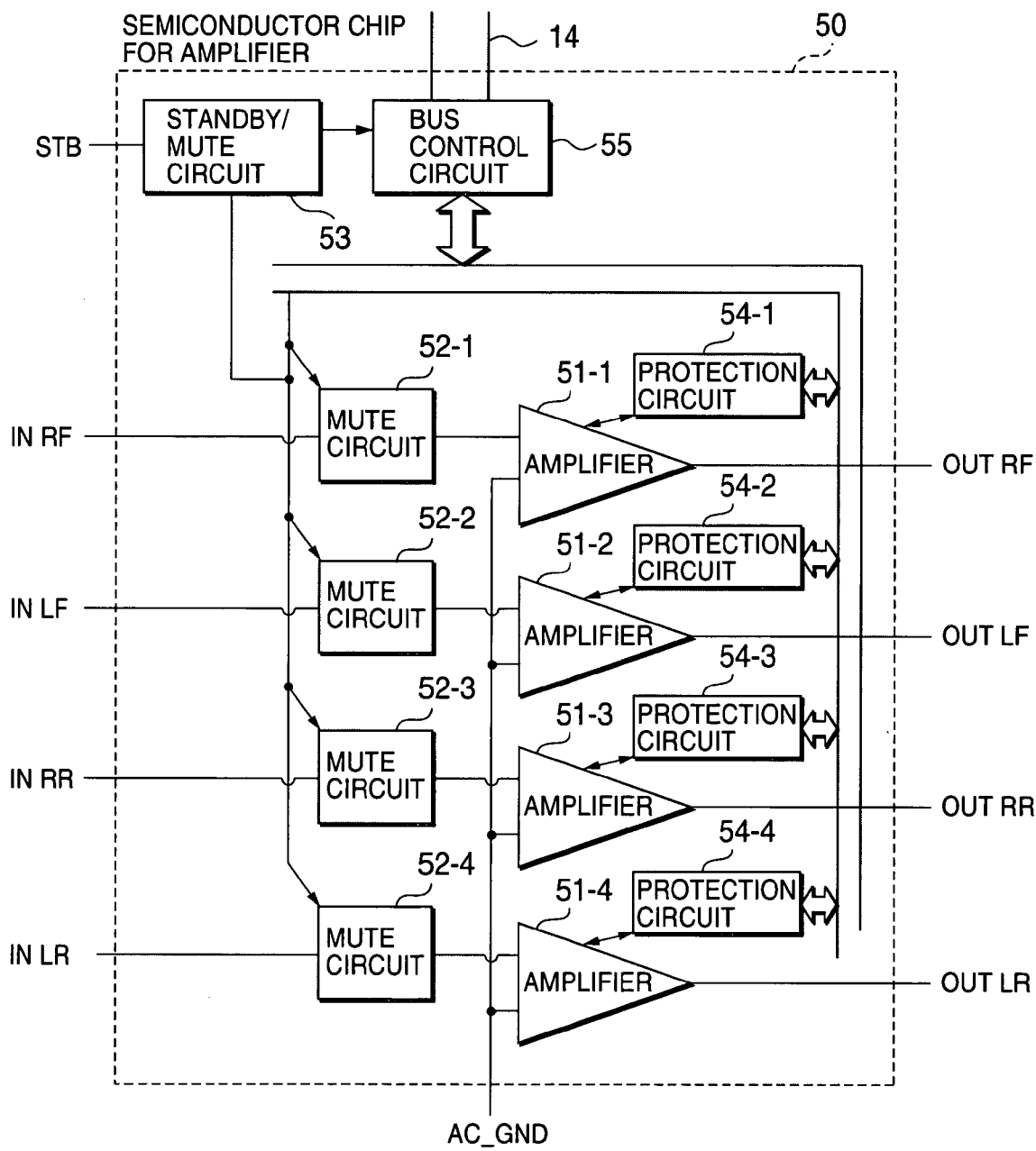
FIG. 3 illustrates the construction of a semiconductor chip for amplifier, according to a preferred embodiment of the present invention.

FIG. 3 illustrates the construction of the amplifier semiconductor chip 50 according to a preferred embodiment of the present invention. The semiconductor chip for amplifier 50 which is utilized in the preferred embodiment of the present invention comprises amplifiers (51-1 to 51-4) for providing 26 dB gain to, for example, four channel (i.e., a right front (RF), a left front (LF), a right rear (RR) and a left rear (LR)) speakers. Also provided are mute circuits (52-1 to 52-4) for realizing output muting function in case of, for example, power-off, excessively large inputs or the like, a standby/mute circuit 53 for reducing POP noise which brings up at the time of power-on or the like, protection circuits (54-1 to 54-4) which interrupt the amplifier outputs upon detecting temperature rise or erroneous connection and a bus control circuit 55 which performs information transmission with the semiconductor chip for voltage regulation 30 by way of the bus 14 in conformity to the I2C. It is to be noted that information transmission can also be performed by way of a simple internal bus which is not in conformity to the I2C.

The protection circuits (54-1 to 54-4) shuts off the outputs from the amplifiers (51-1 to 51-4) at the time when the predetermined temperature (for example, 170° C. as the second setup temperature) has been reached. The outputs from the amplifiers (51-1 to 51-4) are also shut off in accordance with the instructions from the semiconductor chip for voltage regulation 30 which are received through the bus control circuit 55. In other words, the semiconductor chip for amplifier 50 is shut down at high temperature depending on the internally set predetermined temperature (for example, 170° C. as the second setup temperature) and is also shut down depending on the temperature detected by the semiconductor chip for voltage regulation 30 which constitutes the multichip module. The setup temperature (the second setup temperature) set in advance is determined as appropriate temperature for temperature protection function of the semiconductor chip for amplifier 50 by itself. Information on the setup temperature is determined by the settings of the protection circuits (54-1 to 54-4). It is possible to design that the settings are stored in the memory provided in the protection circuits (54-1 to 54-4) or a memory provided in any other location.

Now, a shutdown operation at high temperature will be described hereafter.

The semiconductor chip for voltage regulation 30 and the semiconductor chip for amplifier 50 are shut down by themselves at high temperature under control of the temperature protection circuit 33 and the protection circuits (54-1 to 54-4). It is to be noted that the semiconductor chip for voltage regulation 30 and the semiconductor chip for amplifier 50 are disposed in a single package to define the multichip module 10 which is provided with cooling means utilizing, for example, a heat sink or the like (not shown). However, temperature rise of one of the chips may cause temperature rise of the other chip. In contrast to, for example, the internal power consumption of approximately 30 watts in the semiconductor chip for voltage regulation 30, the semiconductor chip for amplifier 50 supplies high output power, for example, 50 watts×4 channels=200 watts and has an internal power consumption of approximately 20 watts. Accordingly, although the semiconductor chip for voltage regulation 30 is normally shut down due to the heat generated by itself, there are instances when the semiconductor chip for voltage regulation 30 is shut down under the influence of the heat generated by the semiconductor chip for amplifier 50 which has a larger internal power consumption.

In addition, in the semiconductor chip for amplifier 50, in a case, for example, when the user sets the volume to extremely high, heat generated inside the IC increases to shut down the outputs from the amplifiers (51-1 to 51-4) by the protection circuits (54-1 to 54-4), thereby reducing the sound outputs from the speakers. Subsequently, when temperature goes down, the outputs are restored to recover the sound outputs from the speakers. Accordingly, although audio outputs are frequently interrupted, recovery from the shutdown is very quick and thus causing little influence upon the other devices. On the other hand, in case of interruption of the semiconductor chip for voltage regulation 30, power supply for the entire equipment stops, thereby shutting down the power supply for, for example, the driver for the CD, the MD and the like. As a result, it takes some time for the mechanical components such as the mechanical deck to recover stable operation after shutdown. The semiconductor chip for voltage regulation 30 and the semiconductor chip for amplifier 50 are preferably operated such that the semiconductor chip for amplifier 50 is shut down first and then the semiconductor chip for voltage regulation 30 is shut down. In other words, it is preferable that shutdown priority sequence of the semiconductor chip for amplifier 50 is set to higher than that of the semiconductor chip for voltage regulation 30.

Accordingly, in the preferred embodiment of the present invention, shutdown setup temperatures for the temperature protection circuit 33 of the semiconductor chip for voltage regulation 30 and the protection circuits (54-1 to 54-4) for the semiconductor chip for amplifier 50 are differentiated as described hereinabove. The setup temperature (the second setup temperature) for the semiconductor chip for amplifier 50 having a higher shutdown priority is set to low (for example, 170° C.) and the setup temperature (the first setup temperature) for the semiconductor chip for voltage regulation 30 is set to high (or example, 180° C.). In this configuration, the amplifier output is shut down theoretically prior to shutdown of the power supply, thereby minimizing the influence to the user at the time when shutdown takes place.

However, the shutdown circuit utilizing the temperature protection circuit 33 and the protection circuits (54-1 to 54-4) causes a given variation in the actual operation with regard to the setup temperatures. Assuming that operational variable in the setup temperatures which are specified as designed values for the temperature protection circuit 33 and the protection circuits (54-1 to 54-4) is, for example, ±10° C., it is required to differentiate the setup temperatures by 20° C. in order to ensure the correct operation in accordance with the priority sequence. However, it is necessary to set even higher temperature as one of the setup temperatures for shutdown, thereby sacrificing operation in more reliable temperature range. In order to alleviate such problem, the preferred embodiment of the present invention sets a lower setup temperature (the third setup temperature) for the temperature protection circuit 33 of the semiconductor chip for voltage regulation 30 which is the chip having a lower shutdown priority sequence than the setup temperature (the first setup temperature) at which the semiconductor chip for voltage regulation chip 30 shuts itself down. As a result, the semiconductor chip for amplifier 50 is compulsorily shut down by way of the bus 14 upon the detection of the third setup temperature.

At this event, regardless of the shutdown condition of the semiconductor chip for amplifier 50, a shutdown signal is outputted from the semiconductor chip for voltage regulation 30. As a result, regardless of presence in or magnitude of variations between the temperature protection circuit 33 and the protection circuits (54-1 to 54-4), the chips are made to shut down sequentially from higher to lower priority sequence so as to protect the entire multichip module 10 from the trouble at high temperature. Although the above-mentioned third setup temperature is set to be lower than the first setup temperature, it is to be noted that the third setup temperature can be set to the same temperature as or different temperature from the setup temperature (the second setup temperature) for the semiconductor chip for amplifier 50. In other words, the third setup temperature can be set independent of the second setup temperature.

Figure 4:
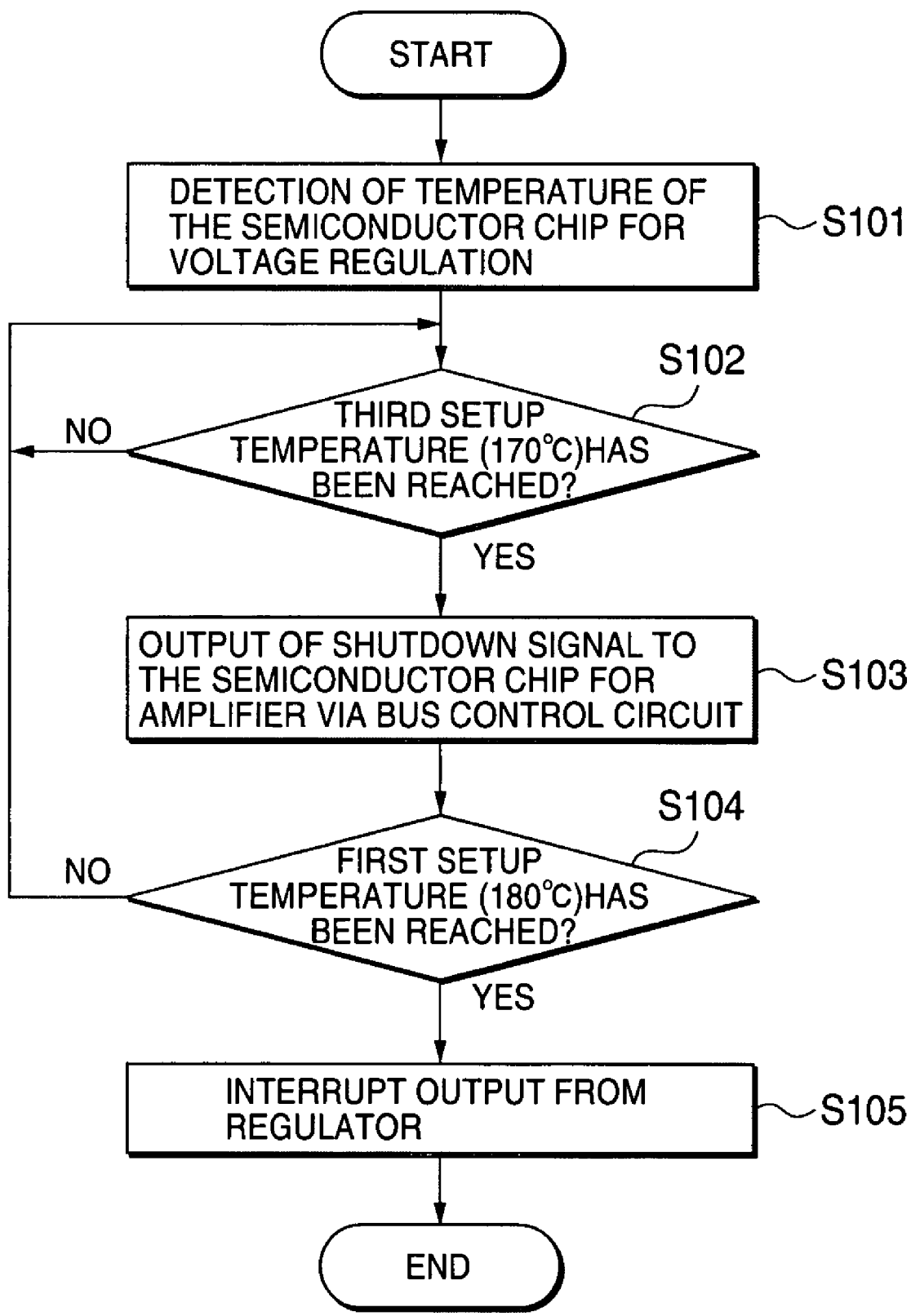
FIG. 4 is a flowchart to show the shutdown procedure in the temperature protection circuit for the semiconductor chip for voltage regulation, according to a preferred embodiment of the present invention.

FIG. 4 is a flowchart to show the shutdown procedure in the temperature protection circuit 33 for the semiconductor chip for voltage regulation 30 which has been described hereinabove. In the temperature protection circuit 33, temperature in the semiconductor chip for voltage regulation 30 is detected, in step S101). By the detection, judgment is made whether or not the detected temperature has reached the predetermined setup temperature (for example, 170° C.) which is lower than the first setup temperature (for example, 180° C.) at which the shutdown is supposed to take place by itself, in step S102. If the detected temperature has not reached the third setup temperature, such judgment is continued. On the other hand, if it is determined that the third setup temperature has been reached, a shutdown signal is outputted to the semiconductor chip for amplifier 50 by way of the bus control circuit 35, in step S103). Then, judgment is made whether or not the first setup temperature (for example, 180° C.) has been reached, in step S104. If not reached yet, the procedure goes back to step 102. On the other hand, if the first setup temperature has been reached, the outputs from the regulators (31-1 to 31-5) are interrupted by itself, in step S105, and the shutdown procedure ends. Then, in case when the temperature returns to a safe level, a recovery procedure to recover the regulators (31-1 to 31-5) will be carried out. It is to be noted in step S103 that, by shutting down the semiconductor chip for amplifier 50 which has large power consumption, it is possible to reduce the frequency of self shutdowns of the semiconductor chip for voltage regulation 30.

As described hereinabove, in such multichip including a plurality of semiconductor chips which have a predetermined shutdown priority sequence because of the function of each chip, the present invention is configured to surely determine the shutdown priority sequence. For this end, among a plurality of semiconductor chips, in a semiconductor chip in which shutdown can be delayed (i.e., having a lower shutdown priority sequence), set is a lower setup temperature than the setup temperature at which shutdown takes place by itself. The arrangement is made so that the other semiconductor chip constituting the multichip, i.e., the semiconductor chip which is supposed to shut down earlier (having a higher shutdown priority sequence) is compulsorily shut down at the time when temperature in the one semiconductor chip has reached the lower setup temperature.

In the above arrangement, it becomes possible to solve the following problems associated with a multichip module in which a plurality of semiconductor chips, each designed to shutdown individually, are disposed in a single package:

① Shutdown takes place at unexpected occasions due to reciprocal thermal influence among semiconductor chips.

② A semiconductor device experiences high temperature at an unexpected occasion and frequent shutdowns under influence of chips which generates a large amount of heat.

③ With respect to shutdown temperatures, there are some occasions when a semiconductor chip of higher shutdown priority sequence shuts down later than the others because of variations in temperature at which each semiconductor chip actually shuts down.

④ If setup temperature is determined by taking such variations into consideration, differences in setup temperature become very large and thus the setup temperature for the semiconductor chip of a higher shutdown priority sequence becomes very low so that it shuts down very frequently. On the other hand, the setup temperature for a semiconductor chip of lower shutdown priority sequence may be very high, thereby forcing such semiconductor chip to be used at unreliable temperature range and shortening its lifetime.

In other words, according to the preferred embodiment of the present invention, in the multichip module which disposes a plurality of semiconductor chips in a single package the semiconductor chips can be shut down in a desired sequential order independent of variations in temperature characteristic of each semiconductor chip. Also, it can avoid the need for providing an unnecessarily large margin in the setup temperature for shutting each semiconductor chip down. Moreover, it enables to internally process by using the bus or a simple control line within the multichip, thereby making it unnecessary to perform external control.

It is to be noted that the preferred embodiment of the present invention is described on the multichip module including two (i.e., first and second) semiconductor chips, but the present invention can be applied to any multichip module including more than two semiconductor chips, i.e., any multichip module including a third semiconductor chip, a fourth semiconductor chip, etc. In such a case, it is possible to compulsorily shut down a chip of higher shutdown priority sequence by a chip of relatively lower shutdown priority sequence (i.e., the chip which is expected to be active as latest as possible). At this time, a chip may be provided with a plurality of threshold levels (setup temperatures) for controlling shutdown of a plurality of chips. Alternatively, it is possible to provide plural pairs each defining the relationship of the first and the second semiconductor chips.

Although the present invention having been described hereinabove in its preferred form with a certain degree of particularity, other changes, variations, combinations and sub-combinations are possible therein. It is therefore to be understood that any modifications will be practiced otherwise than as specifically described herein without departing from the scope and spirit of the present invention.

For example, although a plurality of semiconductor chips are disposed in parallel relationship in the preferred embodiment of the present invention present above, it is possible that the present invention may be applied to a multichip module in which a plurality of semiconductor chips are stacked. Also, in the above preferred embodiment of the present invention, the description has been made on an example of applying the multichip module to an audio equipment which is installed in a vehicle, but the present invention should not be limited only to such audio equipment and may be applied to multichip modules for other applications as well.

What is claimed is:

1. A multichip module including in a same package a first semiconductor chip and a second semiconductor chip that automatically shut down when respectively reaching a predetermined temperature, said multichip module comprising:
   a setup temperature detection means provided in said first semiconductor chip for detecting whether or not said first semiconductor chip has reached a previously set setup temperature; and
   a compulsory shutdown means for compulsorily shutting down said second semiconductor chip based on a detection of said setup temperature by said setup temperature detection means;
   wherein said first semiconductor chip comprises a power semiconductor chip for supplying a predetermined electric power to an onboard audio equipment; and said second semiconductor chip comprises an amplifying semiconductor chip for amplifying an audio signal of said onboard audio equipment.

2. A multichip module comprising:
   a first semiconductor chip that shuts itself down based on a first setup temperature; and
   a second semiconductor chip provided in a same package with said first semiconductor chip and that shuts itself down based on a second setup temperature;
   wherein said first semiconductor chip outputs a signal for shutting down said second semiconductor chip, when reaching a third setup temperature which is lower than said first setup temperature.

3. The multichip module according to claim 2, wherein said second setup temperature comprises a temperature that is lower than said first setup temperature.

4. The multichip module according to claim 2, wherein said third setup temperature comprises a temperature that may be equal or different from said second setup temperature.

5. A multichip shutdown method for a multichip having a plurality of semiconductor chips having priority sequence for shutdown included in a same package, said method comprising the steps of:
   determining whether a first semiconductor chip having a lowest shutdown priority has reached a setup temperature; and
   compulsorily shutting down a second semiconductor chip of higher shutdown priority if said first semiconductor chip has reached said setup temperature;
   wherein said first semiconductor chip shuts itself down if reaching a previously set temperature which is higher than said setup temperature.

* * * * *